United States Patent
Chindalore et al.

(10) Patent No.: US 7,544,980 B2
(45) Date of Patent: Jun. 9, 2009

(54) SPLIT GATE MEMORY CELL IN A FINFET

(75) Inventors: Gowrishankar L. Chindalore, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 102 days.

(21) Appl. No.: 11/342,155

(22) Filed: Jan. 27, 2006

(65) Prior Publication Data

US 2007/0176223 A1 Aug. 2, 2007

(51) Int. Cl.
*H01L 29/06* (2006.01)

(52) U.S. Cl. .................. 257/288; 257/619; 257/314; 257/E29.264

(58) Field of Classification Search ......... 257/314–326, 257/E29.264, 288, 619
See application file for complete search history.

(56) References Cited

U.S. PATENT DOCUMENTS

| 5,969,383 | A  | * | 10/1999 | Chang et al. ............ 257/316 |
|---|---|---|---|---|
| 6,388,293 | B1 | * | 5/2002 | Ogura et al. ............ 257/365 |
| 6,735,123 | B1 |   | 5/2004 | Tripsas et al. |
| 6,933,183 | B2 |   | 8/2005 | Beintner et al. |
| 2004/0206996 | A1 |   | 10/2004 | Lee et al. |
| 2004/0235300 | A1 | * | 11/2004 | Mathew et al. ............ 438/689 |
| 2004/0253799 | A1 |   | 12/2004 | Taylor, Jr. et al. |
| 2005/0098822 | A1 |   | 5/2005 | Mathew et al. |
| 2005/0280103 | A1 |   | 12/2005 | Langdo et al. |

OTHER PUBLICATIONS

PCT International Search Report and Written Opinion regarding International Application No. PCT/US 06/62281, Applicant's file reference SC14944TP, mailed Feb. 14, 2008.

* cited by examiner

*Primary Examiner*—Bradley K Smith
*Assistant Examiner*—Alexander Belousov
(74) *Attorney, Agent, or Firm*—David G. Dolezal; James L. Clingan, Jr.

(57) ABSTRACT

A memory cell is implemented using a semiconductor fin in which the channel region is along a sidewall of the fin between source and drains regions. One portion of the channel region has a select gate adjacent to it and another other portion has the control gate adjacent to it with a charge storage structure there between. In some embodiments, independent control gate structures are located adjacent opposite sidewalls of the fin so as to implement two memory cells.

20 Claims, 9 Drawing Sheets

SPLIT GATE MEMORY CELL IN A FINFET

BACKGROUND OF THE INVENTION

1. Field of the Invention

This invention relates in general to semiconductor devices and more particularly to split gate memory devices.

2. Description of the Related Art

Some types of memories such as non volatile memories utilize split gate transistors for implementing memory cells of a memory array. A transistor having a split gate configuration includes a control gate and a select gate for controlling read and write operations of the memory cell.

What is desirable is an improved memory with memory cells having split gate configurations.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the invention. The description is intended to be illustrative of the invention and should not be taken to be limiting.

FIGS. 1-15 set forth various views of a wafer during various stages of its manufacture of one embodiment of a memory array including split gate memory cells implemented in Fin-FETs.

Figure 1:
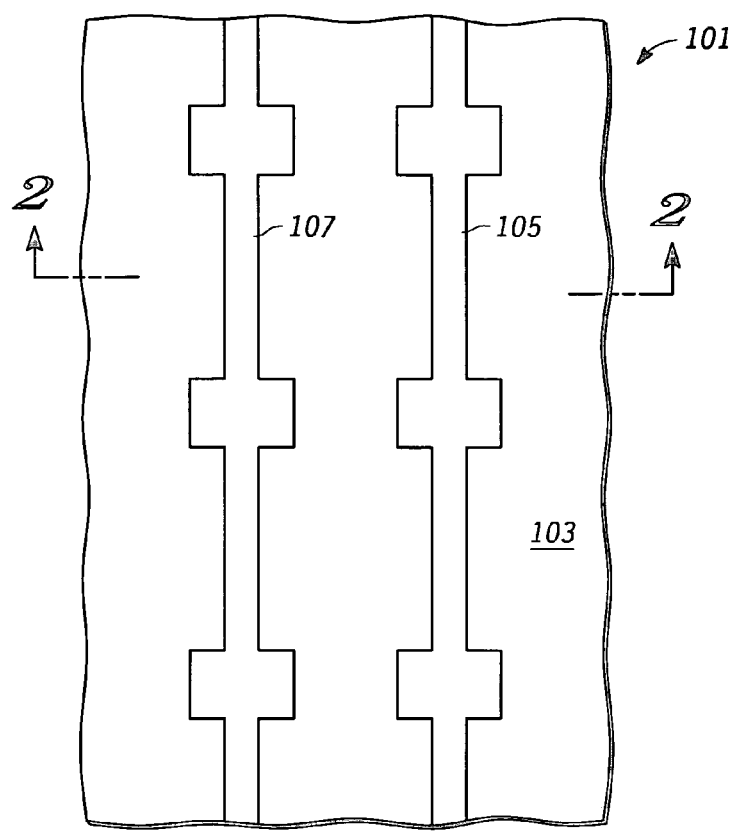
FIG. 1 is a partial top view of a wafer during a stage in its manufacture according to one embodiment of the present invention.

FIG. 1 is a partial top view of wafer 101. FIG. 1 shows wafer 101 including two semiconductor fins 105 and 107 running horizontally in a first direction on wafer 101. In one embodiment, fins 105 and 107 are of a silicon material (e.g. monocrystalline silicon) but may be of other semiconductor materials in other embodiments. Wafer 101 may include other fins (not shown) running in the same direction.

In one embodiment, fins 105 and 107 are formed by patterning a semiconductor layer on wafer 101 according to the pattern shown in FIG. 1. In one embodiment, such patterning would include forming a layer of photo resist (not shown) over the semiconductor layer and patterning the photo resist utilizing photolithography techniques to form a mask structure. Subsequently, the layer of semiconductor material is etched as per the patterned mask structure.

In one embodiment, fins 105 and 107 may be doped to provide a first conductivity type. In one embodiment, the fins are doped prior to patterning fins 105 and 107. However, in other embodiments, they may be doped after patterning.

Figure 2:
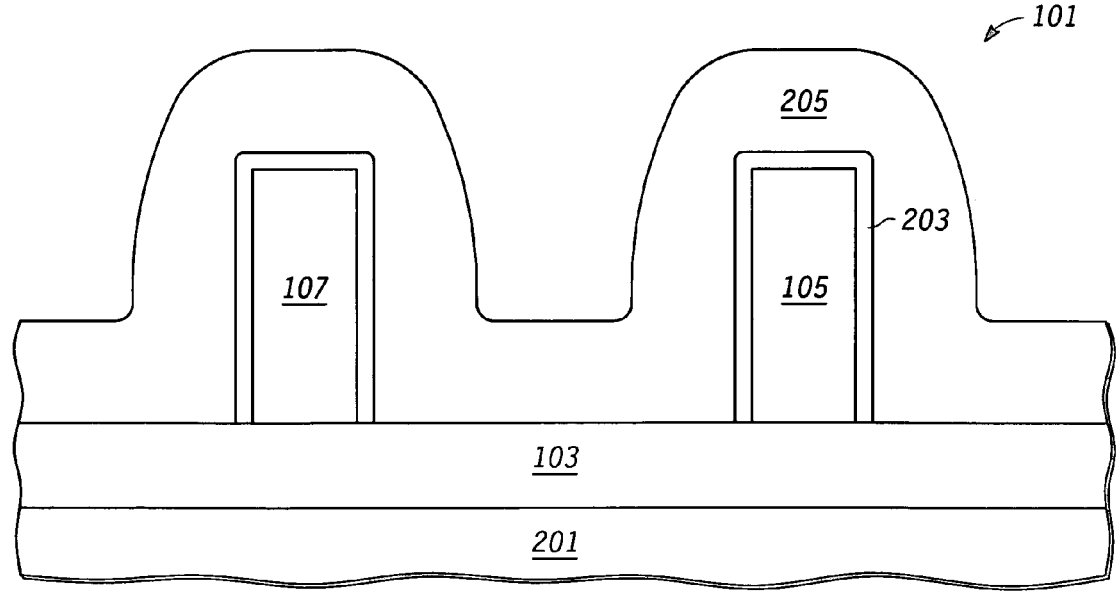
FIG. 2 is a partial cutaway side view of a wafer during another stage of its manufacture according to one embodiment of the present invention.

FIG. 2 is partial side cutaway view of wafer 101 after the formation of a select gate dielectric 203 on fins 105 and 107 and the formation of a layer 205 of gate material over wafer 101 including over fins 105 and 107. In the embodiment shown, dielectric 203 is located on the top and sidewalls of fins 105 and 107. In one embodiment, dielectric 203 is formed by oxidizing the material of fins 105 and 107. In one embodiment, the dielectric is silicon oxide. However, in other embodiments, dielectric 203 may be formed by other processes (e.g. deposition) and/or formed of other materials.

Gate material layer 205 is utilized in subsequent processes in forming select gates for split gate transistors. In one embodiment, layer 205 includes polysilicon but may be of other select gate materials (e.g. metal) in other embodiments. In one embodiment, layer 205 is deposited by a chemical vapor deposition (CVD) process but may be formed by other processes in other embodiments.

In the embodiment shown, fins 107 and 105 are located on dielectric layer 103 (e.g. silicon oxide). Dielectric layer 103 is located over a substrate material 201 (e.g. bulk silicon). However, wafer 101 may have other configurations in other embodiments.

In one embodiment, fins 105 and 107 have a height of 200 nanometers and a width (e.g. the width dimension shown in FIG. 2) of 500 nanometers. However, the fins may have other widths, heights, and/or lengths in other embodiments, including other height to width (e.g. the width shown in FIG. 2 of fins 105 and 107) ratios.

Figure 3:
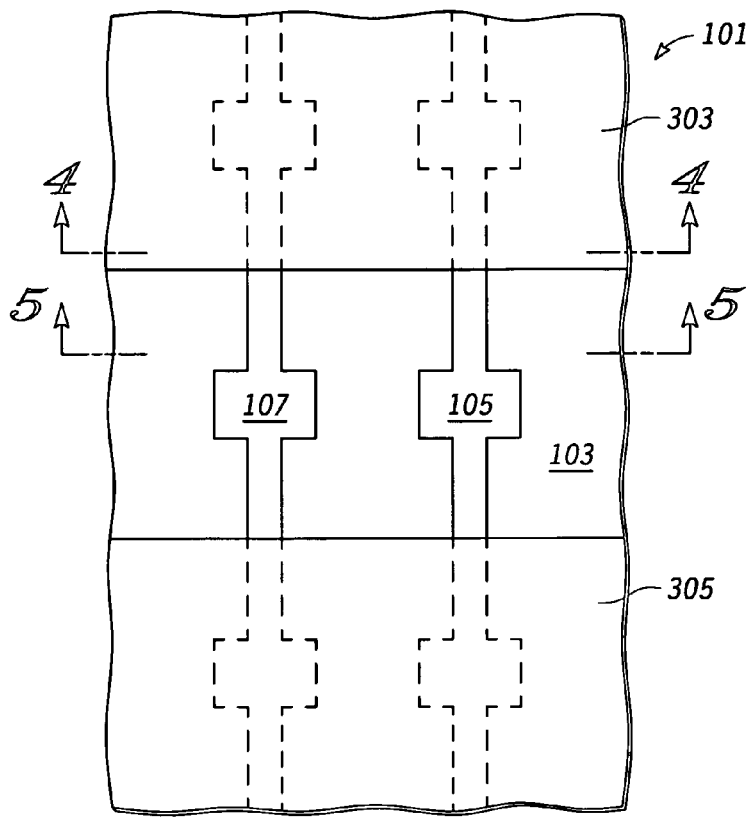
FIG. 3 is a partial top view of a wafer during another stage of its manufacture according to one embodiment of the present invention.

FIG. 3 is a partial top view of wafer 101 after layer 205 has been patterned to form a plurality select gate structures with gate structures 303 and 305 being shown in FIG. 3. In the embodiment shown, select gate structures 303 and 305 run in a horizontal direction perpendicular to fins 105 and 107. The patterning exposes portions of dielectric layer 103.

In the embodiment of FIG. 3, gate dielectric 203 is removed from the areas where layer 205 is removed to expose portions of fins 107 and 105.

Figure 4:
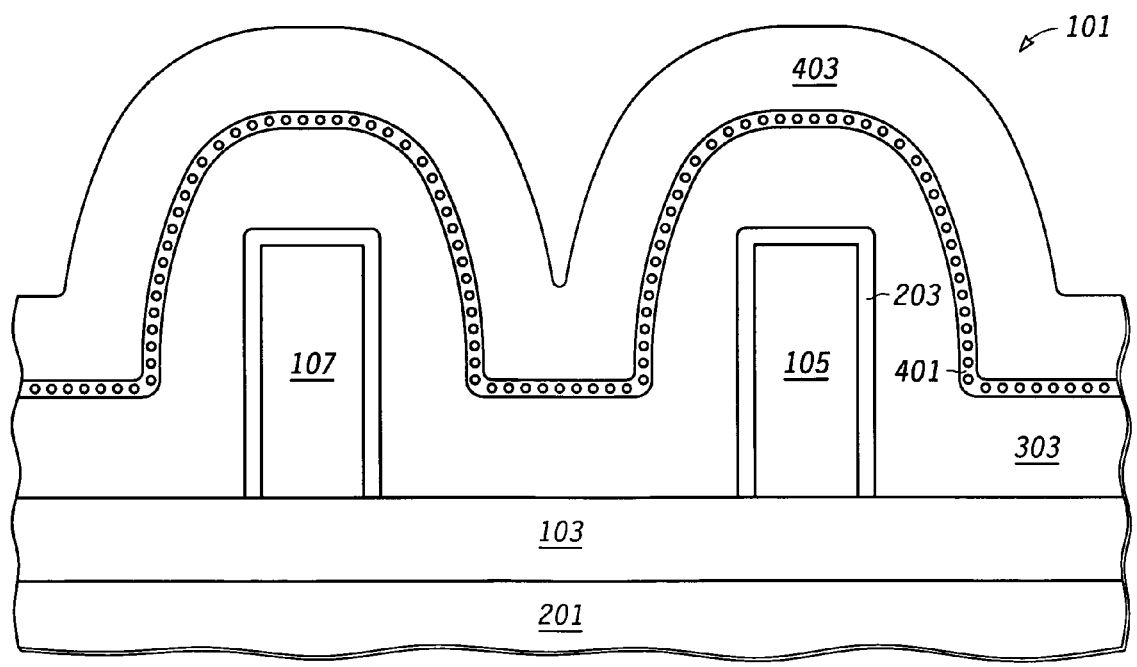
FIG. 4 is a partial cutaway side view of a wafer during another stage of its manufacture according to one embodiment of the present invention.
Figure 5:
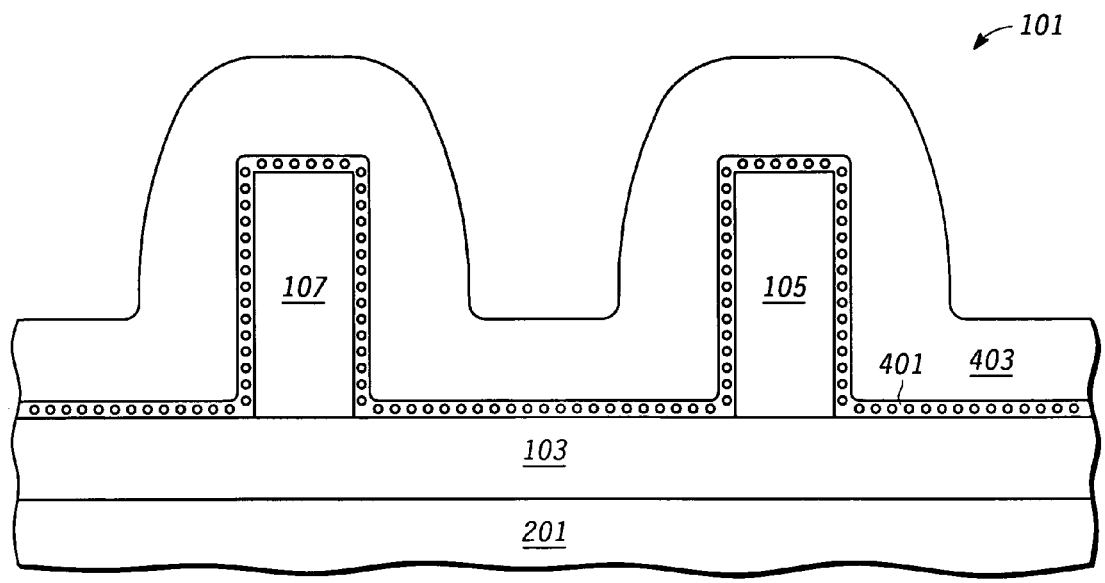
FIG. 5 is another partial cut away side view of a wafer during another stage of its manufacture according to one embodiment of the present invention.

FIGS. 4 and 5 are partial side cut away views of wafer 101 at different views with respect to FIG. 3 and after the formation of charge storage layer 401 and a layer 403 of control gate material. In the embodiment shown, charge storage layer 401 includes silicon nanocrystals embedded between dielectric (e.g. oxide and/or nitride) material. However in other embodiments, charge storage layer 401 may include other materials including other types of nanoclusters (e.g. metal nanoclusters, other semiconductor nanocrystals), charge storage metal, or charge storage dielectric (e.g. nitride, high K dielectric) that can be used for storing charge to store information in a memory cell.

In one embodiment, layer 401 is formed by CVD processes, but may be formed by other processes in other embodiments.

Control gate material layer 403 is formed over wafer 101 including over layer 401. In one embodiment, control gate material layer 403 is polysilicon formed by a CVD process, but in other embodiments, may be of other gate materials (e.g. metal) and/or formed by other processes.

FIG. 4 shows a partial cut away side view of wafer 101 at a location where select gate structure 303 overlies wafer 101. FIG. 5 shows a side view of wafer 101 at a location having no select gate structure. As shown in FIG. 4, layer 403 is formed over select gate structure 303 (and over other select gate structures e.g. 305) after layer 205 has been patterned.

Figure 6:
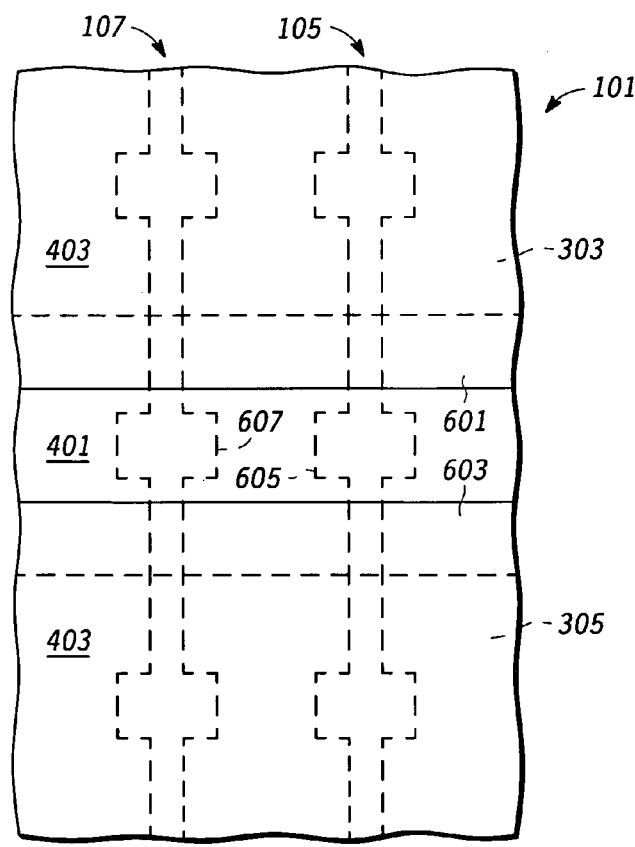
FIG. 6 is a partial top view of a wafer during another stage of its manufacture according to one embodiment of the present invention.

FIG. 6 is a partial top view of wafer 101 after the stage as shown in FIGS. 4 and 5 and after layer 403 has been patterned to form control gate structures 601 and 603 of control gate material layer 403. As shown in FIG. 6, structures 601 and 603 run in the same horizontal direction as structures 303 and 305. In the embodiments shown, structures 601 and 603 cover all of structures 303 and 305, respectively, and have a greater width than structures 303 and 305 respectively.

As shown in FIG. 6, the patterning of layer 403 exposes the charge storage layer 401 located over drain regions 605 and 607 of fins 105 and 107 respectively. In one embodiment, the exposed portion of layer 401 is removed after this stage.

In one embodiment, drain regions 605 and 607 are implanted with dopants (either to provide a p-type conductivity e.g. boron, or to provide an n-type conductivity e.g. arsenic, phosphorous) at the stage of manufacture shown in FIG. 6.

Figure 7:
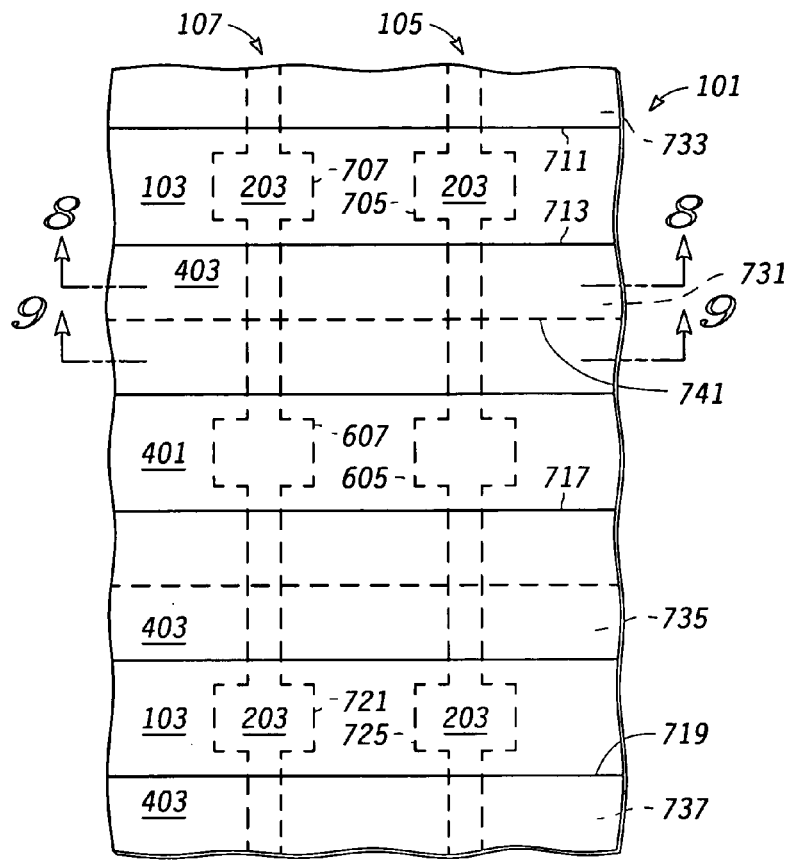
FIG. 7 is a partial top view of a wafer during another stage of its manufacture according to one embodiment of the present invention.

FIG. 7 shows a partial top view after structure 601 is patterned to form control gate structures 711 and 713 of control gate material layer 403 and structure 603 is patterned to form control gate structures 717 and 719 of control gate material layer 403. During the patterning of structures 601 and 603, structures 303 and 305 are also patterned wherein structure 303 is patterned to form structures 733 and 731 and structure 305 is patterned to form structures 735 and 737. During the patterning, material of layer 401 is also removed.

In FIG. 7, structure 711 covers and is wider than structure 733, structure 713 covers and is wider than structure 731. Dash line 741 shows the extent of structure 731 under structure 713. The sidewalls of structures 713 and 731 facing regions 707 and 705 are vertically aligned. Structure 717 covers and is wider than structure 735. Structure 719 covers and is wider than structure 737.

The patterning of structures 601, 603, 303 and 305 exposes gate dielectric 203 on source regions 707 and 721 of fin 107, exposes gate dielectric 203 on source regions 705 and 725 of fin 105, and exposes layer 103.

In one embodiment, source regions 707, 705, 721, and 725 are implanted with dopants to make these source regions of a particular conductivity type (either p-type or n-type). In the embodiment where the drain regions 605 and 607 were previously implanted, a mask (not shown) used in the patterning to expose dielectric 203 over the source regions remains during the implantation. However, in other embodiments, both the source regions and the drain regions are implanted at the same time. With those embodiments, the patterning mask would be removed prior to implantation.

FIGS. 8-15 further describe embodiments where the control gate structures 713, 711, 717, and 719 are further processed to form separate control gate structures adjacent each sidewall of a fin. However, with other embodiments, gate structures 713, 711, 717, and 719 are utilized as they appear in FIG. 7 wherein the control gate includes a portion located over the fin. See the embodiments of FIGS. 16 and 17.

Figure 8:
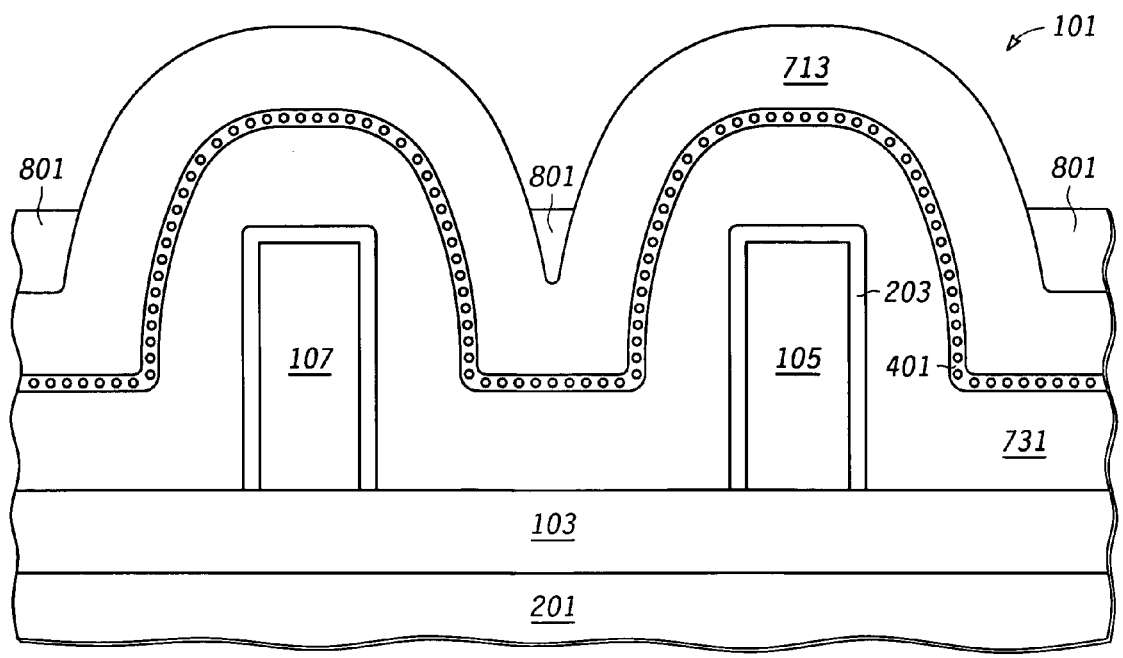
FIG. 8 is a partial cut away side view of a wafer during another stage of its manufacture according to one embodiment of the present invention.
Figure 9:
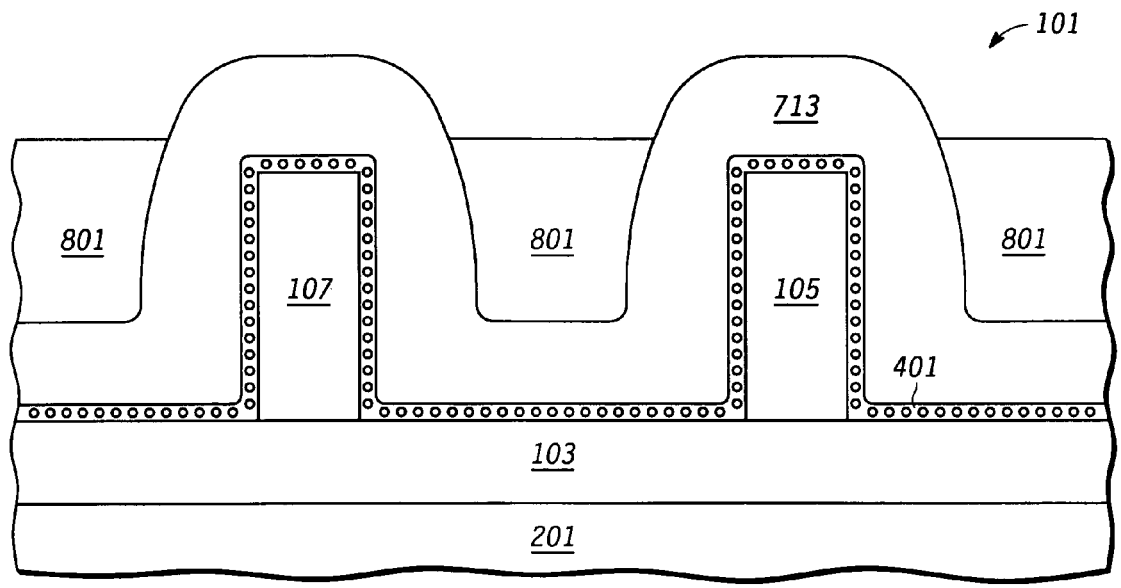
FIG. 9 is another partial cut away side view of a wafer during another stage of its manufacture according to one embodiment of the present invention.

FIGS. 8 and 9 show partial cut away side views of wafer 101 after a layer 801 of planar material is formed over wafer 101. The location of the views of FIGS. 8 and 9 are shown in FIG. 7. Layer 801 is utilized in further separating portions of control gate structures 713, 711, 717, and 719 to form separate control gate structures adjacent each sidewall of a fin structures.

In some embodiments, layer 801 may be made of e.g. photo resist, spin on glass, or an organic antireflective coating material. In some embodiments, layer 801 may be formed by spin on techniques or by CVD processes followed by chemical mechanical polish or reflow. In one embodiment, layer 801 may first be formed to a first level and then etched back to the level shown in FIGS. 8 and 9. In one embodiment, layer 801 is etched back by conventional dry or wet etch techniques. In other embodiments, the resultant structure of layer 801 may be formed by the deposition of the material of layer 801 to the level shown in FIGS. 8 and 9.

In the embodiments of FIGS. 8 and 9, layer 801 is at a level such that the top of structure 713 is exposed over fins 107 and 105.

In some embodiments, a layer of nitride (e.g. not shown) or other material may be formed over structures 711, 713, 717, and 719 prior to the formation of planar layer 801.

Figure 10:
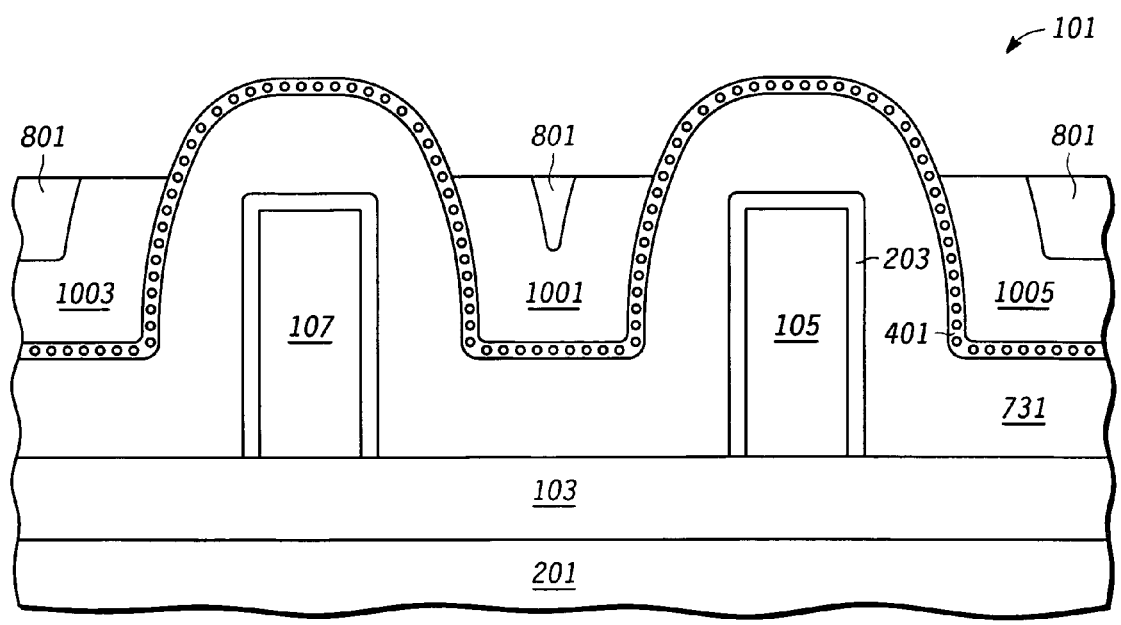
FIG. 10 is a partial cut away side view of a wafer during another stage of its manufacture according to one embodiment of the present invention.
Figure 11:
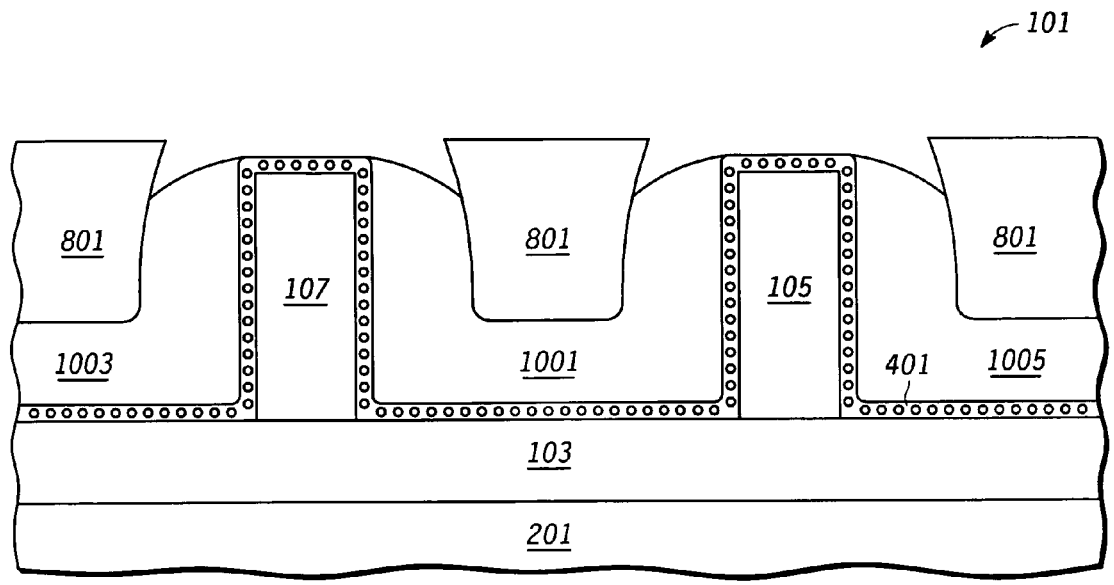
FIG. 11 is another partial cut away side view of a wafer during another stage of its manufacture according to one embodiment of the present invention.

FIGS. 10 and 11 show partial cutaway side views of wafer 101 after the portion of control gate structures 711, 713, 717, and 719 located over fins 105 and 107 have been removed. In the embodiments of FIGS. 10 and 11, the portions of structure 713 over fins 105 and 107 is removed to form control gate structures 1003, 1001, and 1005. In some embodiments, the exposed portions of the control gate structures are removed by a non abrasive etching (e.g. wet or dry) over fins 105 and 107. In the embodiment shown, the charge storage layer 401 is utilized by as an end point etch of the poly silicon of structures 711, 713, 717, and 719.

Figure 12:
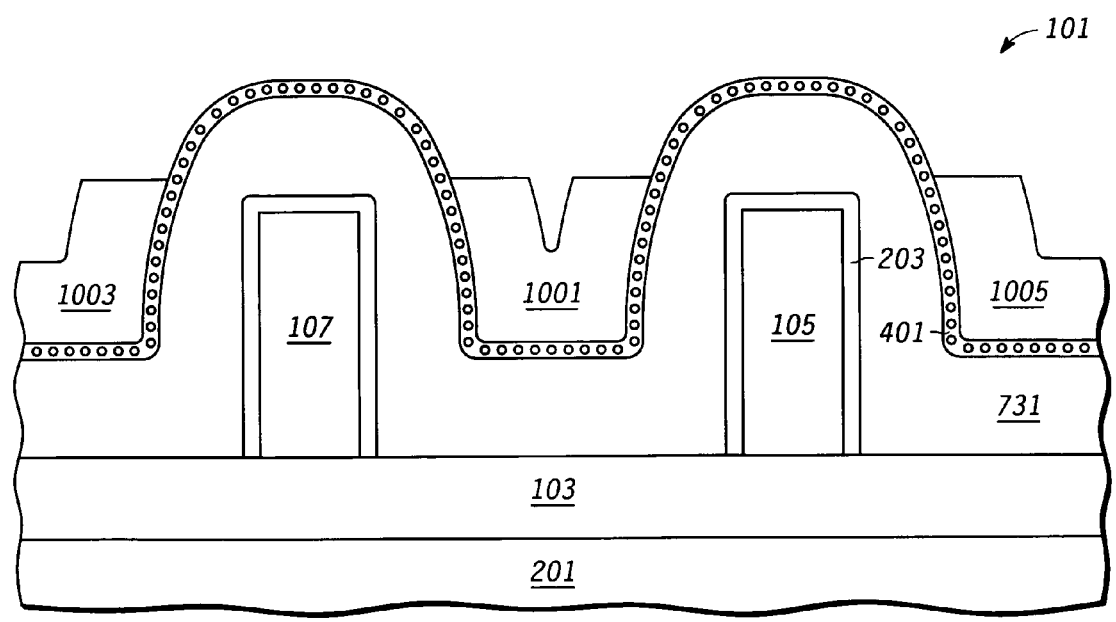
FIG. 12 is a partial cut away side view of a wafer during another stage of its manufacture according to one embodiment of the present invention.
Figure 13:
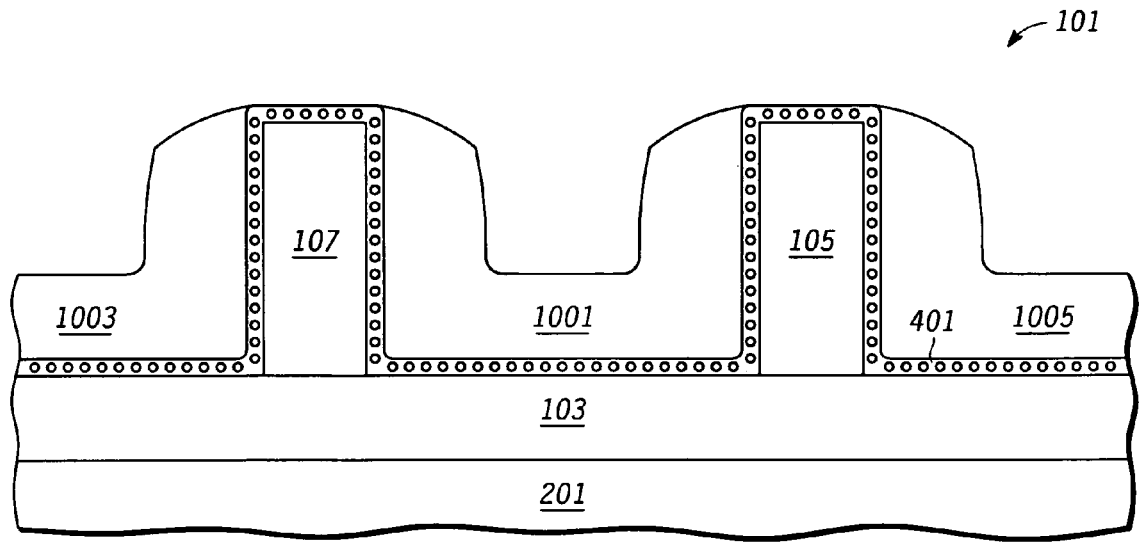
FIG. 13 is another partial cut away side view of a wafer during another stage of its manufacture according to one embodiment of the present invention.

FIGS. 12 and 13 show partial cutaway side views of wafer 101 at the same locations as FIGS. 10 and 11 respectfully after the removal of planar layer 801.

Examples of such processes for removing gate material over a semiconductor fin may be found in U.S. Pat. No. 6,903,967, and having a common assignee, all of which is incorporated by reference. However, the gate material over fins 105 and 107 may be removed by other conventional methods e.g. including utilizing an abrasive etching.

In other embodiments, the material of the control gate structures over the fins may be removed prior to the patterning of structures 601 and 603, e.g. at the stage shown in FIG. 6. In examples of such embodiments, implantation of the drain regions 607 and 605 would occur prior to the removal of the control gate material over fins 105 and 107.

Figure 14:
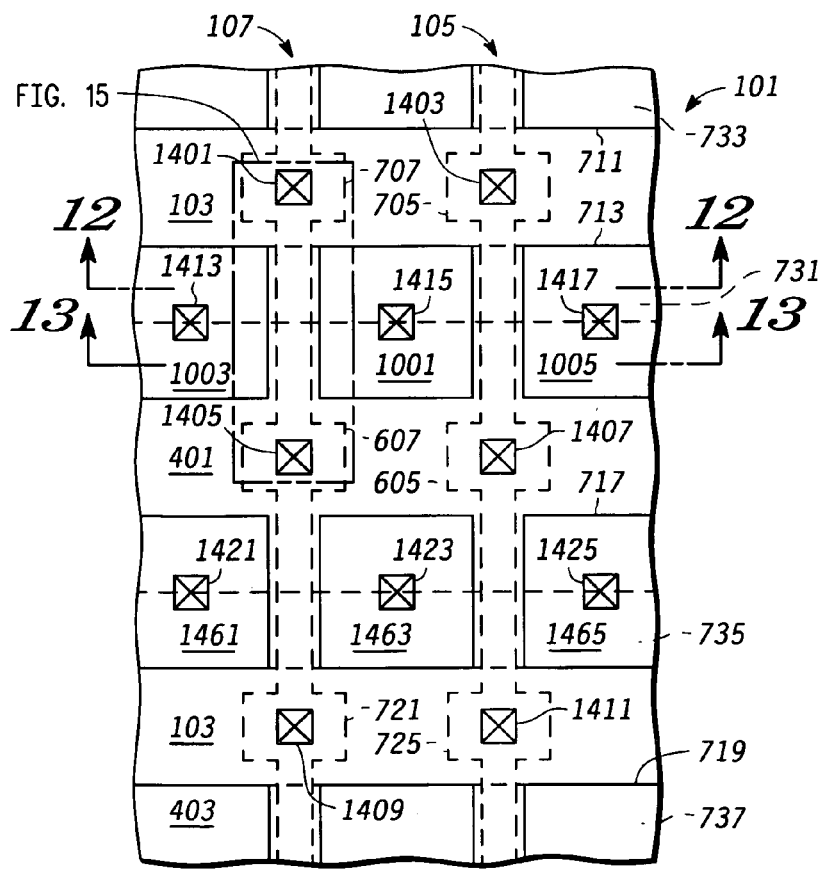
FIG. 14 is a partial top view of a wafer during another stage of its manufacture according to one embodiment of the present invention.

FIG. 14 is partial top view of wafer 101 after the stage shown in FIGS. 12 and 13 and after the formation of contacts to the control gate structures, source regions, and drain regions. In the embodiment of FIG. 14, the portions of structures 711, 713, 717, and 719 have been removed over fins 105 and 107. Note that the portions of structures 733, 731, 735, and 737 over fins 105 and 107 remain (as shown by the dashed lines over the fin structures).

In the embodiment of FIG. 14, contacts 1405 and 1407 are formed to connect to drain regions 607 and 605 respectively. Contacts 1401, 1403, 1409 and 1411 are formed to connect to source regions 707, 705, 721, and 725, respectively. Contacts 1413, 1415 and 1417 connect to control gate structures 1003, 1001, and 1005, respectively. Also, contacts 1421, 1423, and 1425 connect to control gate structures 1461, 1463, and 1465, respectively.

In one embodiment, contacts are formed by depositing a layer (not shown) of dielectric material (e.g. silicon oxide, TEOS) over wafer 101, planarizing the layer of dielectric material, etching holes through the dielectric material and through charge storage layer 401 in some locations, and then filling the holes with contact material (e.g. tungsten) including in some embodiments, barrier layers. However, contacts may be formed by other processes and/or from other materials in other embodiments.

In some embodiments, exposed portions of layer 401 (e.g. over drain regions 607 and 605) may be removed prior to the formation of the contacts.

Figure 15:
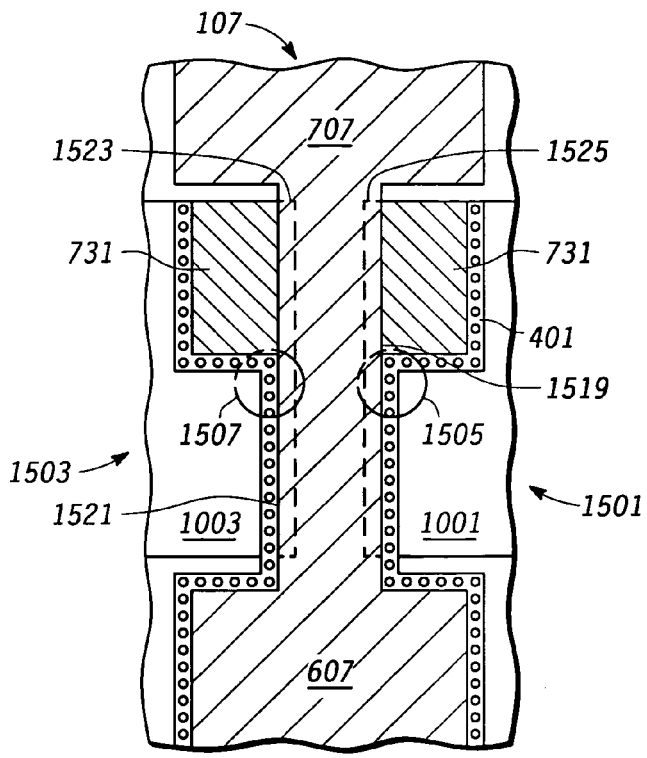
FIG. 15 is a partial cut away top view of a wafer during another stage of its manufacture according to one embodiment of the present invention.

FIG. 15 shows a partial cutaway top view of wafer 101. In the view of FIG. 15, fin 107 is shown at a plane where fin 107 and select gate structure 731 are partially cut away.

Due to the removal of the control gate material over fin 107 to form independent control gate structures 1003 and 1001, two memory cells are implemented with two FinFET split gate transistors as shown in FIG. 15. Typically, a FinFET includes a channel region (e.g. channel regions 1523 and 1525) implemented in a semiconductor fin (e.g. 107), wherein the channel region includes a portion located along a sidewall of the fin. The channel region has a carrier (e.g. electrons for N-channel devices and holes for P-channels devices) transport in the general horizontal direction (e.g. from source region 707 to drain region 607) in the fin. In the embodiment shown, a first FinFET 1501 has a channel region 1525 that includes a portion located along sidewall 1519 and a second FinFET 1503 having a channel region 1523 that includes a portion located along sidewall 1521. The channel regions may extend into the fin by different dimensions in other embodiments.

In the embodiment shown, split gate FinFET 1503 includes a charge storage location 1507 in charge storage layer 401 and FinFET 1501 has a charge storage location 1505 in charge layer 401. In one embodiment, a charge storage location is capable of storing a charge when programmed that affects the voltage threshold of its respective FinFET. In one embodiment, the charge storage locations 1507 and 1505 can be programmed by source side injection (SSI) programming techniques. In one embodiment of a SSI technique to program location 1507, a positive voltage (e.g. +5 volts) is applied to select gate structure 731, a positive gate voltage (e.g. +7 volts) is applied to control gate structure 1003, a positive voltage (e.g. +5 voltage) is applied to drain region 607, and substantially 0 volts is applied to source region 707. During this programming, electrons from source region 707 travel through channel region 1523 of FinFET 1503 to drain region 607. Some of these electrons get accelerated in the gap between the select gate and the control gate and get accelerated into charge storage location 1507. During the programming of charge storage location 1507, a ground voltage is applied to control gate structure 1001 so that there is no carrier flow in channel region 1525 and charge is not injected into charge storage location 1505. In other embodiments, other programming voltages may be utilized. In other embodiments, other types of programming techniques may be utilized.

To read charge storage location 1507, a read positive voltage (e.g. +5 voltage) is applied to select gate structure 731, a positive voltage (e.g. +3 volts) is applied to control gate structure 1003, substantially 0 volts is applied to source region 707, and drain region 607 is coupled to a sense amplifier (not shown). Other reading techniques including the use of other voltages may be utilized in other embodiments.

In some embodiments, a split gate memory cell array of a particular cell number may be advantageously implemented in a smaller area due to the utilization of charge storing locations in FinFETs. Prior art split gate memory cell arrays may take up more space due to their planar configuration.

Also, the utilization of a split gate configuration in a FinFET may allow for the utilization of lower power during programming in that SSI techniques may be used as opposed to other types of prior art memory cells implemented in FinFETs. In addition, a split gate configuration in a FinFET may allow for faster programming due to the use of SSI programming techniques. Consequently, embodiments shown or described herein may allow for the benefits of SSI programming to be achieved in a memory utilizing FinFET transistors.

For alternative embodiments where the control gate structure includes material over the fin (e.g. see the embodiments of FIGS. 16 and 17), control gate structures 1003 and 1005 would be connected and continuous with control gate material over fin 107. With these embodiments, the charge storage location would include both locations 1507 and 1505 in that these locations would not programmable independently.

Figure 16:
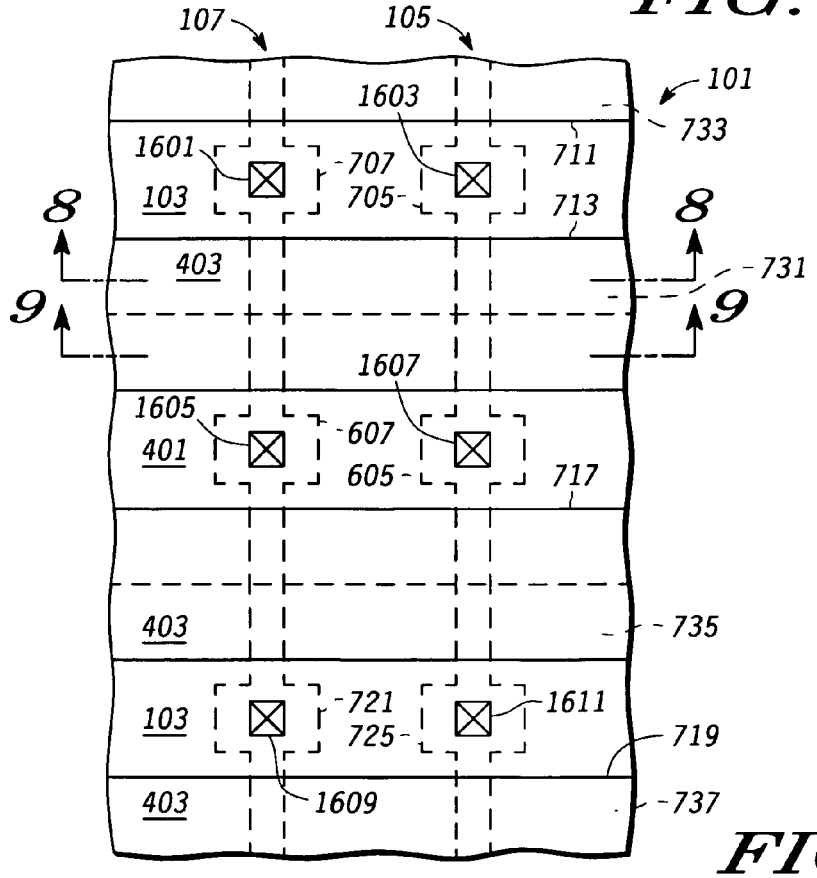
FIG. 16 is a partial top view of a wafer during another stage of its manufacture according to another embodiment of the present invention.

FIG. 16 is a partial top view of wafer 101 in an alternative embodiment where the control gates include material located over the fins. In the embodiment of FIG. 16, control gate structures 711, 713, 717, and 719 include portions located over fins 105 and 107. With such a configuration, each charge storage location of a cell includes a location adjacent each side of two opposite sidewalls of a fin. See the discussion above regarding the alternative embodiments of FIG. 15.

In the embodiment of FIG. 16, contacts 1601, 1603, 1609, and 1611 connect to source regions 707, 705, 721, and 725 respectively. Contacts 1605 and 1607 connect to drain regions 607 and 605, respectively.

In the embodiment of FIG. 16, there are no contacts to structures 711, 713, 717, and 719 between fin 107 and 105 in that the contacts to these structures may be made at end locations of these structures, due to these structures being continuous over the fins.

With the embodiments of FIG. 14 and 16, wafer 101 may be subject to further processing for forming other conventional structures such as interconnect layers including interconnects and interlevel dielectrics, passivation layers, and external connectors (e.g. bond pads). Afterwards, wafer 101 may be singulated (e.g. with a saw) into individual integrated circuits and packaged to form integrated circuit packages.

Figure 17:
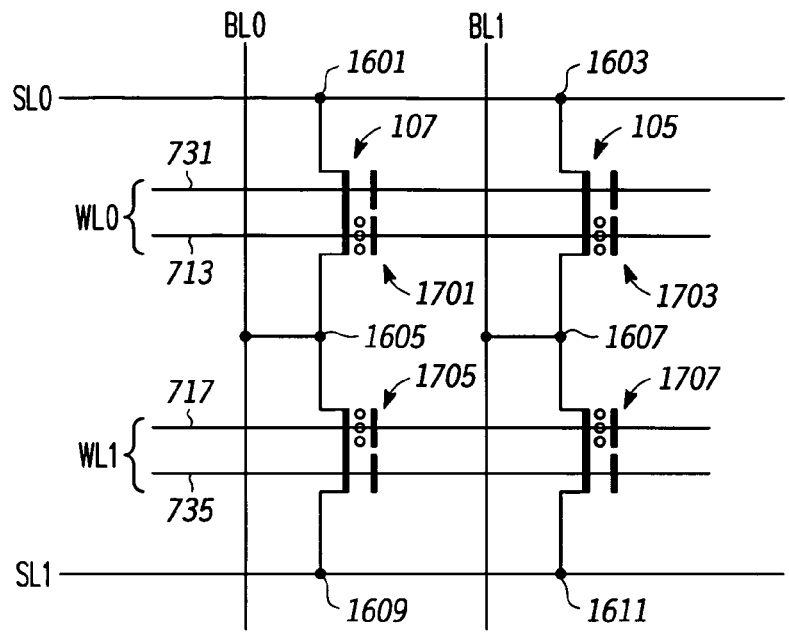
FIG. 17 is a circuit diagram of a memory array according to one embodiment of the present invention.

FIG. 17 is a circuit diagram of the array shown in FIG. 16, where the control gates include material located over the fins and the charge storage locations include locations adjacent to opposite sidewalls of a fin.

In FIG. 17, memory cells 1701 and 1705 are implemented in fin 107 and memory cells 1703 and 1707 are implemented in fin 105. Structure 713 is utilized as the control gate for cells 1701 and 1703 and structure 717 is utilized as the control gate for cells 1705 and 1707. Structure 731 is utilized as the select gate for cells 1701 and 1703 and structure 735 is utilized as the select gate for cells 1705 and 1707. A first word line (WL0) includes structures 731 and 713. As second word line WL1 includes structures 717 and 735. Bit line BL0 is connected to contact 1605 and bit line BL1 is connected to contact 1607. Source line SL0 is connected to source contacts 1601 and 1603. Source line SL1 is connected source contacts 1609 and 1611.

Figure 18:
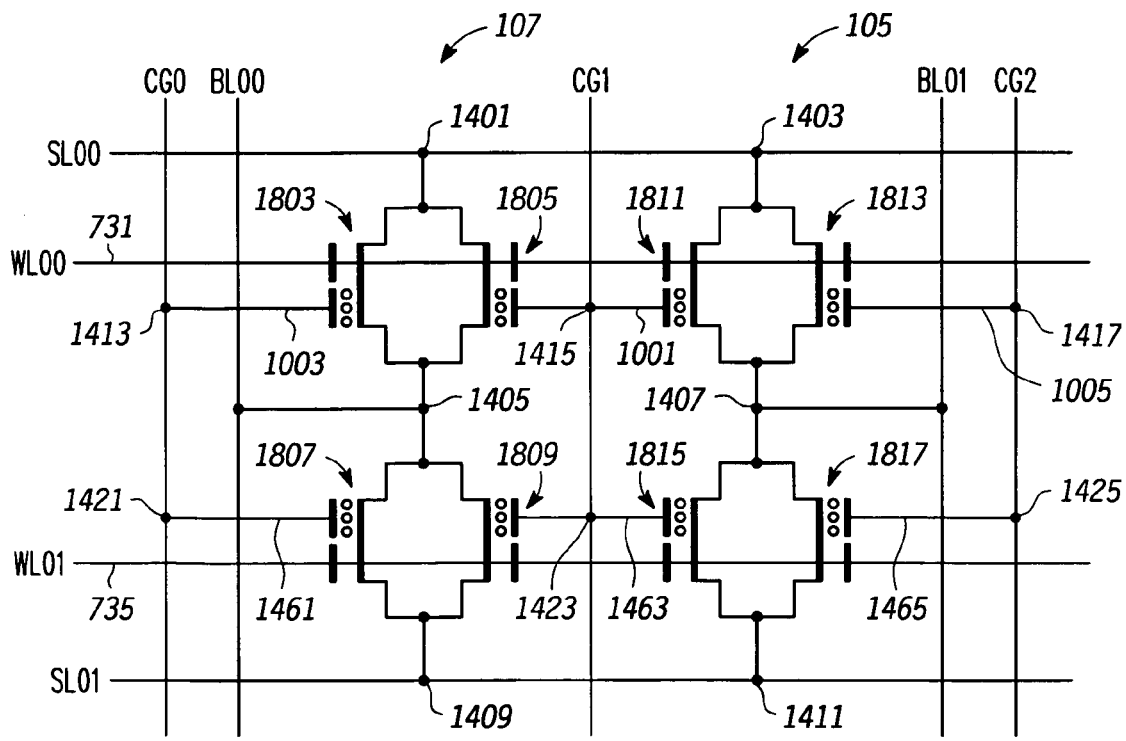
FIG. 18 is a circuit diagram of a memory array according to one embodiment of the present invention.

FIG. 18 is a circuit diagram of the array shown in FIG. 14. With this array, the control gate structures do not include material over the fins and are not continuous across the fins. However, the array of FIG. 18 implements twice as many bits per area as the embodiment of FIG. 17 in that independent charge storage locations are located adjacent to opposite sidewalls of a fin. See the description of the embodiment shown in FIG. 15.

In FIG. 18, memory cells 1803, 1805, 1807, and 1809 are implemented in fin 107 and memory cells 1811, 1813, 1815, and 1817 are implemented in fin 105.

Structure 731 is utilized as a select gate for cells 1803, 1805, 1811, and 1813 and a first word line WL00. Structure 735 is utilized as a select gate for cells 1807, 1809, 1815, and 1817 and a second word line WL01. Structure 1003 is utilized as a control gate for cell 1803. Structure 1001 is utilized as a control gate for cells 1805 and 1811. Structure 1005 is utilized as a control gate from cell 1813. Structure 1461 is utilized as a control gate for cell 1807. Structure 1463 is utilized as a control gate for cells 1809 and 1815. Structure 1465 is utilized as a control gate for cell 1817. A first control gate line CG0 is coupled to structure 1003 via contact 1413 and coupled to structure 1461 via contact 1421. A second control gate line CG1 is coupled to structure 1001 via contact 1415 and coupled to structure 1463 via contact 1423. A third control gate line CG2 is coupled to structure 1005 via contact 1417 and coupled to structure 1465 via contact 1425.

A first source line SL00 is connected to source contacts 1401 and 1403. A second source line SL01 is connected to source contacts 1409 and 1411. A first bit line BL00 is connected to drain contact 1405 and a second bit line BL01 is connected to drain contact 1407.

The embodiments of FIGS. 17 and 18 may include other conventional control circuitry (not shown) including line drivers and sense amplifiers for applying voltages and/or currents for reading, erasing and programming the cells of these arrays.

Other embodiments may have other configurations including other source and drain configurations. For example, referring to FIG. 14, the semiconductor material of the semiconductor fins may extend between source region 707 and source region 705 and semiconductor material may extend between source region 721 and source region 725.

The embodiment of FIG. 14 shows a two memory cell structure where the select gate structure 731 is utilized as the select gate for two cells e.g. 1811 and 1813 (see FIG. 18) that include separate control gate structures (1001, 1005) on each side of the fin (e.g. 105). However in other embodiments, a two cell structure may be implemented where the control gate structure is utilized for a control gate for both cells and both cells include separate select gates on each side of the fin.

In the embodiment shown, layer 401 is shown as remaining over fins 105 and 107 in the view of FIGS. 12 and 13. However, in other embodiments, portions of the charge storage layer may be removed during various stages of manufacture. In one embodiment, portions of charge storage layer 401 may be removed after the patterning of layer 405. See the embodiment of FIG. 8. Also, portions of layer 401 over fins 105 and 107 may be removed prior to the formation of layer 403.

In one embodiment, a memory device includes a first semiconductor fin having a first sidewall and a channel region. The channel region includes a portion along the first sidewall and is located between a source region and a drain region. Carriers travel substantially horizontally in the channel region. The memory device includes a select gate structure including a portion adjacent to a first portion of the first sidewall and adjacent to a first portion of the channel region along the first sidewall. The memory device includes a charge storage structure having a first portion adjacent a second portion of the first sidewall and adjacent to a second portion of the channel region along the first sidewall. The memory device includes a control gate structure having a first portion adjacent to the first portion of the charge storage structure.

In another embodiment, a memory device includes a first semiconductor fin having a first sidewall and a second sidewall, a drain region, a source region, a first channel between the source region and the drain region and along the first sidewall, a second channel between the source region and drain region and along the second sidewall. Carriers travel substantially horizontally in the first channel region and the second channel region. The memory device includes a gate dielectric along a first portion of the first sidewall and along a first portion of the second sidewall. The memory device also includes a select gate structure on the gate dielectric, a first storage layer along a second portion of the first sidewall and along a second portion of the second sidewall, a first control gate structure having a first portion adjacent to the first storage layer along the second portion of the first sidewall, and a second control gate structure having a first portion adjacent to the first storage layer along the second portion of the second sidewall.

In another embodiment, a method of making a semiconductor device includes forming a semiconductor fin on a wafer. The semiconductor fin has a first sidewall and a second sidewall opposite the first sidewall. The method includes forming a layer of select gate material over the wafer including over the semiconductor fin, forming a layer of charge storage material over the wafer including over the semiconductor fin, forming a layer of control gate material over the wafer including over the semiconductor fin, and forming a select gate structure. The forming the select gate structure includes patterning the layer of select gate material. The select gate structure includes a first portion adjacent a first portion of the first sidewall. The layer of charge storage material includes a portion adjacent a second portion of the first sidewall. The method includes forming a control gate structure. The forming the control gate structure includes patterning the layer of control gate material. The control gate structure includes a first portion adjacent to the portion of the layer of charge storage material adjacent a second portion of the first sidewall. The semiconductor fin includes a first channel region. The first channel region includes a portion along the first sidewall. Carriers travel substantially horizontally in the first channel region. A first portion of the first channel region along the first sidewall is located adjacent to the select gate structure. A second portion of the first channel region along the first sidewall is located adjacent to the portion of the layer of charge storage material.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory device, comprising:
   a first semiconductor fin having a first sidewall and a channel region, wherein the channel region includes a portion along the first sidewall and is located between a source region and a drain region, wherein carriers travel substantially horizontally in the channel region;
   a select gate structure including a portion adjacent to a first portion of the first sidewall and adjacent to a first portion of the channel region along the first sidewall;
   charge storage material at a first location having a first portion adjacent a second portion of the first sidewall and adjacent to a second portion of the channel region along the first sidewall; and
   a control gate structure having a first portion adjacent to the first portion of the charge storage material of the first location;
   wherein the control gate structure includes a portion located directly over a portion of the select gate structure.

2. A memory device, comprising:
   a first semiconductor fin having a first sidewall and a channel region, wherein the channel region includes a portion along the first sidewall and is located between a source region and a drain region, wherein carriers travel substantially horizontally in the channel region;
   a select pate structure including a portion adjacent to a first portion of the first sidewall and adjacent to a first portion of the channel region along the first sidewall;
   charge storage material at a first location having a first portion adjacent a second portion of the first sidewall and adjacent to a second portion of the channel region along the first sidewall;
   a control gate structure having a first portion adjacent to the first portion of the charge storage material at the first location;
   wherein the first semiconductor fin has a second sidewall opposite the first sidewall, the second sidewall includes a second channel region, the second channel region includes a portion along the second sidewall, wherein carriers travel substantially horizontally in the second channel region;
   wherein the select gate structure includes a second portion adjacent to a first portion of the second sidewall and adjacent to a first portion of the second channel region along the second sidewall;
   charge storage material at a second location having a first portion adjacent to a second portion of the second sidewall and adjacent to a second portion of the second channel region along the second sidewall; and
   a second control gate structure having a first portion adjacent to the first portion of the charge storage material at the second location.

3. The memory device of claim 2, further comprising:
   a second semiconductor fin running substantially parallel to the first semiconductor fin, wherein the second semiconductor fin has a first sidewall and a third channel region, wherein the third channel region includes a portion along the first sidewall of the second semiconductor fin and is located between a source region and a drain region, wherein carriers travel substantially horizontally in the third channel region; and
   wherein the select gate structure includes a third portion adjacent to a first portion of the first sidewall of the second semiconductor fin and adjacent to a first portion of the third channel region along the first sidewall of the second semiconductor fin;
   charge storage material at a third location having a first portion adjacent to a second portion of the first sidewall of the second semiconductor fin and adjacent to a second portion of the third channel region along the first sidewall of the second semiconductor fin;
   wherein a first control gate structure has a second portion adjacent to the first portion of the third charge storage material at the third location.

4. The memory device of claim 2 wherein:
   the control gate structure and the channel region serve as a control gate and a channel region for a first memory cell;
   the second control gate structure and the second channel region serve as a control gate and a channel region for a second memory cell.

5. The memory device of claim 4 wherein the charge storage material at the first location and the charge storage material at the second location are implemented in a layer of charge storage material.

6. The memory device of claim 1 wherein the charge storage material at the first location is implemented in a layer that includes nanoclusters surrounded by dielectric material.

7. The memory device of claim 1, wherein the first semiconductor fin is over a planar insulating surface, wherein the first semiconductor fin comprises monocrystalline silicon.

8. The memory device of claim 1, wherein:
   the first semiconductor fin further comprises a second channel region including a portion along the first sidewall of the first semiconductor fin, the first semiconductor fin including a current terminal region located between the channel region and the second channel region, wherein the second channel region includes a portion along the first sidewall, wherein carriers travel substantially horizontally in the second channel region;
   a second select gate structure including a portion adjacent to a third portion of the first sidewall and adjacent to a first portion of the second channel region along the first sidewall;
   charge storage material at a second location having a first portion adjacent to a fourth portion of the first sidewall and adjacent to a second portion of the second channel region along the first sidewall; and
   a second control gate structure having a first portion adjacent to the first portion of the charge storage material at a second location.

9. The memory device of claim 1, wherein:
   the source region is located in the first semiconductor fin, and the drain region is located in the semiconductor fin.

10. The memory device of claim 1, wherein:
    the first semiconductor fin has a second sidewall opposite the first sidewall;
    the select gate structure includes a second portion adjacent to a first portion of the second sidewall;
    the memory device further comprising charge storage material at a second location having a first portion along a second portion of the second sidewall;

the control gate structure has a second portion adjacent to the first portion of the charge storage material at a second location.

11. The memory device of claim 10, further comprising:
a second semiconductor fin running substantially parallel to the first semiconductor fin wherein the second semiconductor fin has a first sidewall and a second channel region, wherein the second channel region includes a portion along the first sidewall of the second semiconductor fin, wherein carriers travel substantially horizontally in the second channel region of the second semiconductor fin;
charge storage material at a third location having a first portion along a second portion of the first sidewall of the second semiconductor fin and adjacent to a second portion of the channel region along the first sidewall of the second semiconductor fin;
wherein the select gate structure includes a third portion adjacent to a first portion of the first sidewall of the second semiconductor fin and adjacent to a first portion of the channel region along the first sidewall of the second semiconductor fin; and
wherein the control gate structure has a third portion adjacent to the second portion of the first sidewall of the second semiconductor fin and adjacent to the second portion of the channel region along the first sidewall of the second semiconductor fin;
wherein the first portion of the charge storage material at the third location is disposed between the first sidewall of the second semiconductor fin and the third portion of the control gate structure.

12. The memory device of claim 2 wherein the control gate structure includes a portion located directly over a portion of the select gate structure.

13. The memory device of claim 1 further comprising a dielectric located between the control gate structure and the first semiconductor fin.

14. A memory device, comprising:
a first semiconductor fin having a first sidewall and a channel region, wherein the channel region includes a portion along the first sidewall and is located between a source region and a drain region, wherein carriers travel substantially horizontally in the channel region;
a select gate structure including a portion adjacent to a first portion of the first sidewall and adjacent to a first portion of the channel region along the first sidewall;
charge storage material at a first location having a first portion adjacent a second portion of the first sidewall and adjacent to a second portion of the channel region along the first sidewall;
a control gate structure having a first portion adjacent to the first portion of the charge storage material at the first location;
wherein the first semiconductor fin has a second sidewall opposite the first sidewall, the second sidewall includes a second channel region, the second channel region includes a portion along the second sidewall, wherein carriers travel substantially horizontally in the second channel region;
a second select gate structure having a portion adjacent to a first portion of the second sidewall and adjacent to a first portion of the second channel region along the second sidewall;
charge storage material at a second location having a first portion adjacent to a second portion of the second sidewall and adjacent to a second portion of the second channel region along the second sidewall; and
wherein the control gate structure includes a second portion adjacent to the first portion of the charge storage material at the second location.

15. A memory device, comprising:
a first semiconductor fin having a first sidewall and a second sidewall, a drain region, a source region, a first channel between the source region and the drain region and along the first sidewall, a second channel between the source region and drain region and along the second sidewall, carriers travel substantially horizontally in the first channel region and the second channel region;
a gate dielectric along a first portion of the first sidewall and along a first portion of the second sidewall;
a select gate structure on the gate dielectric;
charge storage material located along a second portion of the first sidewall and charge storage material located along a second portion of the second sidewall;
a first control gate structure having a first portion adjacent to the charge storage material located along the second portion of the first sidewall; and
a second control gate structure having a first portion adjacent to the charge storage material located along the second portion of the second sidewall;
wherein the first control gate structure includes a portion located directly over a portion of the select gate structure.

16. The memory device of claim 15 wherein the charge storage material located along a second portion of the first sidewall and the charge storage material located along a second portion of the second sidewall each include nanoclusters.

17. The memory device of claim 15 further comprising:
a second semiconductor fin having a first sidewall and a second sidewall, a drain region, a source region, a first channel between the source region and the drain region and along the first sidewall of the second semiconductor fin, a second channel between the source region and drain region and along the second sidewall of the second semiconductor fin, carriers travel substantially horizontally in the first channel region and the second channel region of the second semiconductor fin;
a second gate dielectric along a first portion of the first sidewall of the second semiconductor fin and along a first portion of the second sidewall of the second semiconductor fin, wherein the select gate structure on the second gate dielectric;
charge storage material located along a second portion of the first sidewall of the second semiconductor fin and charge storage material located along a second portion of the second sidewall of the second semiconductor fin;
wherein the first control gate structure has a second portion adjacent to the charge storage material located along the second portion of the first sidewall of the second semiconductor fin.

18. The memory device of claim 15 wherein the select gate structure includes a structure sidewall that is vertically aligned with a structure sidewall of the control gate structure.

19. The memory device of claim 1 wherein the control gate structure includes a portion located directly over a portion of the select gate structure at a location that is lateral to the fin.

20. The memory device of claim 1 wherein the select gate structure includes a structure sidewall that is vertically aligned with a structure sidewall of the control gate structure.

* * * * *